United States Patent

Kellner et al.

[11] Patent Number: 5,843,819
[45] Date of Patent: Dec. 1, 1998

[54] SEMICONDUCTOR MEMORY DEVICE WITH TRENCH CAPACITOR AND METHOD FOR THE PRODUCTION THEREOF

[75] Inventors: Walter-Ulrich Kellner, Markt Schwaben; Karl-Heinz Küsters, München; Wolfgang Müller, Putzbrunn; Franz-Xaver Stelz, Dachau, all of Germany

[73] Assignee: Siemens Aktiengesellschaft, Munich, Germany

[21] Appl. No.: 898,514

[22] Filed: Jul. 22, 1997

Related U.S. Application Data

[62] Division of Ser. No. 192,188, Feb. 4, 1994, Pat. No. 5,701,022, which is a continuation of Ser. No. 765,042, Sep. 24, 1991, abandoned, which is a continuation-in-part of Ser. No. 527,121, May 22, 1990, abandoned.

[30] Foreign Application Priority Data

May 22, 1989 [EP] European Pat. Off. ......... 89 109 158.9

[51] Int. Cl.$^6$ ................................................. H01L 21/8242
[52] U.S. Cl. ............................................. 438/243; 438/702
[58] Field of Search ..................................... 438/242, 243, 438/244, 386, 387, 702

[56] References Cited

U.S. PATENT DOCUMENTS

| | | | |
|---|---|---|---|
| 4,734,384 | 3/1988 | Tsuchiya | 438/244 |
| 4,761,385 | 8/1988 | Pfiester | 438/243 |
| 4,786,954 | 11/1988 | Morie et al. | 257/304 |
| 4,877,750 | 10/1989 | Okumura | 257/304 |
| 4,914,740 | 4/1990 | Kenney | 257/300 |
| 4,918,500 | 4/1990 | Inuishi | 257/303 |

(List continued on next page.)

FOREIGN PATENT DOCUMENTS

| | | |
|---|---|---|
| 0 108 390 A1 | 5/1984 | European Pat. Off. . |
| 0 164 829 A1 | 12/1985 | European Pat. Off. . |
| 0 176 254 A2 | 4/1986 | European Pat. Off. . |
| 0 177 066 A2 | 4/1986 | European Pat. Off. . |
| 0 180 026 A2 | 5/1986 | European Pat. Off. . |
| 0 187 596 A3 | 7/1986 | European Pat. Off. . |
| 0 287 056 A2 | 10/1988 | European Pat. Off. . |
| 61-108163 A | 5/1986 | Japan . |

OTHER PUBLICATIONS

Half–V$_{cc}$ Sheath–Plate Capacitor DRAM Cell with Self-–Aligned Buried Plate Wiring (Kaga et al.), Transactions on Electron Devices, vol. 35, No. 8, Aug. 1988.

Japanese Patent Abstract No. 61–274357 (Osawa), dated Dec. 4, 1986.

*Primary Examiner*—Chandra Chaudhari
*Attorney, Agent, or Firm*—Herbert L. Lerner; Laurence A. Greenberg

[57] ABSTRACT

A semiconductor memory configuration in a semiconductor substrate includes bit lines, word lines, and memory cells each including one memory capacitor and one MOS selection transistor having two conducting regions and a gate electrode. Each memory capacitor is connected to one of the conducting regions of the transistor. The other of the conducting regions of the transistor is connected to one of the bit lines, and the gate electrode of the transistor is connected to one of the word lines. An insulating field oxide or buried insulating oxide with substantially vertical sidewalls is provided. A trench lies adjacent to the insulating field oxide or buried insulating oxide and adjacent to one of the conducting regions. The capacitors are each disposed in one trench for each memory cell. A first insulating layer covers the inner trench wall surface. A first electrode of the capacitor is disposed perpendicular to the substrate surface on the first insulating layer completely inside the trench. A second insulating layer is disposed on the first electrode. A second electrode is disposed vertically on the second insulating layer in the trench. A contact is connected between the first electrode of the capacitor and one of the conducting regions of the transistor laterally through an opening formed in the first insulating layer on the inner trench wall surface. Methods for producing the semiconductor memory configuration and a memory matrix having at least four of the memory cells, are also provided.

32 Claims, 5 Drawing Sheets

U.S. PATENT DOCUMENTS

| | | | |
|---|---|---|---|
| 4,921,816 | 5/1990 | Ino | 438/243 |
| 4,922,313 | 5/1990 | Tsuchiya | 257/301 |
| 5,006,910 | 4/1991 | Taguchi | 257/305 |
| 5,016,071 | 5/1991 | Kumagai | 257/303 |
| 5,427,972 | 6/1995 | Shimizu et al. | 438/243 |
| 5,432,113 | 7/1995 | Tani | 438/702 |

FIG 17

SEMICONDUCTOR MEMORY DEVICE WITH TRENCH CAPACITOR AND METHOD FOR THE PRODUCTION THEREOF

This is a division of application Ser. No. 08/192,188 filed on Feb. 4, 1994, now U.S. Pat. No. 5,701,022, which was a continuation of application Ser. No. 07/765,042, filed on Sep. 24, 1991, now abandoned, which was a continuation-in-part of application Ser. No. 07/527,121, filed May 22, 1990, now abandoned.

SPECIFICATION

The invention relates to a semiconductor memory configuration in a semiconductor substrate having memory cells each including one trench capacitor and one MOS selection transistor, the trench overlapping an insulating field oxide or buried insulating oxide, the inner surface of the trench being covered with a first insulating layer, a first electrode disposed perpendicular to the substrate surface in the trench on the first insulating layer, a second insulating layer on the first electrode, a second electrode disposed vertically in the trench on the second insulating layer, each memory capacitor being connected to a conducting region of a transistor, the other conducting region of the transistor being connected to a bit line and the gate electrode of the transistor being connected to a word line, and the transistor being disposed outside the trench capacitor. The invention also relates to methods for the production of the semiconductor memory configuration as well as to a matrix having at least four of the memory cells.

Semiconductor memories include a number of memory cells in a semiconductor substrate, such as a silicon substrate, each of which include one capacitor for storing information and one transistor for selecting the particular capacitor. In order to attain short access time with a large memory capacity, the scale of integration of the configuration must be increased. In other words, the space required by a cell must be minimized, given a constant capacitor capacity.

To this end, the capacitor is constructed as a trench capacitor in the substrate as disclosed, for instance, in Published European Application No. A 01 08 390. One electrode is then formed by the substrate and the other by the conductive material with which the trench is filled after the first electrode has been insulated. The spacing of the trenches can be reduced by etching them into the substrate overlapping with the field oxide that insulates the cells from one another and represents the insulation for layers located above them. Such a method is described in Published European Application No. A 0 187 596, wherein the etching of the trenches removes the peripheral zone of the field oxide.

However, such trench capacitors cannot be disposed arbitrarily close together in the substrate, otherwise leakage currents and therefore loss of the memorized information would occur. In order to prevent such a "punch through" phenomenon, a "stacked trench capacitor (STT)" is proposed in Published European Application No. A 0 176 254, for example. In that process, the inner wall of the trench etched into the substrate is lined with a first insulator film, and the two electrodes are accommodated inside the trench in the form of conducting layers, which are separated by a second insulator film as a dielectric. One electrode must then be removed from the trench and connected through a contact hole to a conducting region of the selection transistor. Such a connection through a contact hole parallel to the substrate surface requires two photographic techniques and thus, because of adjustment accuracy, requires a minimum spacing between the trench and the transistor, which impedes any further increase in the scale of integration.

It is accordingly an object of the invention to provide a semiconductor memory configuration having capacitors with two electrodes disposed in a trench and methods for the production thereof, which overcome the hereinafore-mentioned disadvantages of the heretofore-known methods and devices of this general type, in which the scale of integration can be further increased and in particular is not limited by the adjustment accuracy of a photographic technique for producing the transistor-to-capacitor contact, which are simple and readily replicable and which produce memory cells having high reliability.

With the foregoing and other objects in view there is provided, in accordance with the invention, a semiconductor memory configuration in a semiconductor substrate having a surface, comprising bit lines, word lines, memory cells each including one trench memory capacitor and one MOS selection transistor disposed outside the trench capacitor having two conducting regions and a gate electrode, each memory capacitor being connected to one of the conducting regions of a transistor, the other of the conducting regions of the transistor being connected to one of the bit lines, and the gate electrode of the transistor being connected to one of the word lines, an insulating field oxide or buried insulating oxide, a trench overlapping the insulating field oxide or buried insulating oxide and having an inner trench wall surface, a first insulating layer covering the inner trench wall surface, a first electrode of the capacitor disposed perpendicular to the substrate surface on the first insulating layer completely inside the trench, a second insulating layer disposed on the first electrode, a second electrode disposed vertically on the second insulating layer in the trench, and a contact connected between the first electrode of the capacitor and one of the conducting regions of the transistor laterally through an opening formed in the first insulating layer on the inner trench wall surface.

In accordance with another feature of the invention, the first insulating layer is formed of a material from the group consisting of silicon oxide and polysilicon oxide.

In accordance with a further feature of the invention, the first insulating layer is formed of silicon nitride.

In accordance with an added feature of the invention, the second insulating layer is a three-layer dielectric formed of polysilicon oxide, silicon nitride and nitride oxide.

In accordance with an additional feature of the invention, the substrate is formed of doped silicon, and the first and second electrodes are formed of doped polycrystalline silicon of the opposite conduction type.

In accordance with yet another feature of the invention, the conducting region of the transistor connected to the capacitor is the source region.

In accordance with yet a further feature of the invention, the trench has an upper edge, and the opening in the first insulating layer is formed in the upper edge of the trench and is filled with a portion of material of the first electrode.

In accordance with yet an added feature of the invention, the second electrode completely fills the trench.

With the objects of the invention in view, there is also provided a method for producing a semiconductor memory configuration in a semiconductor substrate having memory cells each including one trench capacitor and one MOS selection transistor, which comprises forming a trench with an inner trench wall and an upper edge in a semiconductor substrate for receiving a memory capacitor; producing a first insulating layer on the inner trench wall; forming an opening in the first insulating layer at a location on the upper edge of the trench for producing a contact with the substrate; depositing and anisotropically etching back a first conducting layer for forming a first electrode of the capacitor; depositing a second insulating layer as a dielectric of the capacitor; depositing a second conducting layer filling the trench, and texturing the second conducting layer to form a second electrode; producing a transistor in the vicinity of the trench with a conducting region of the transistor in electrical contact with the first electrode through the opening in the first insulating layer; and producing word lines and bit lines.

With the objects of the invention in view, there is furthermore provided a method for producing a semiconductor memory configuration in a semiconductor substrate having memory cells each including one trench capacitor and one MOS selection transistor, which comprises forming a trench with an inner trench wall and an upper edge in a semiconductor substrate for receiving a capacitor; producing a first insulating layer on the inner trench wall; depositing a conducting or insulating layer and anisotropically etching back; forming an opening in the first insulating layer at a location on the upper edge of the trench for producing a contact with the substrate; depositing a first conducting layer bonding the substrate through the opening and forming a first electrode of the capacitor by anisotropically etching back; depositing a second insulating layer as a dielectric of the capacitor; depositing a second conducting layer filling the trench and texturing the second conducting layer to form a second electrode; producing a transistor in the vicinity of the trench with a conducting region of the transistor in electrical contact with the first electrode through the opening in the first insulating layer; and producing word lines and bit lines.

With the objects of the invention in view, there is moreover provided a method for producing a semiconductor memory configuration having memory cells each including one trench capacitor and one MOS selection transistor, in a semiconductor substrate having a surface, which comprises forming a trench with an inner trench wall in a semiconductor substrate down to the depth of a trench contact to be subsequently produced; applying a protective layer for the trench contact; removing the protective layer from surfaces parallel to the substrate surface and from part of the inner trench wall; deepening the trench down to the total depth of a capacitor to be subsequently produced; applying a first insulating layer to the inner trench wall; removing the remaining protective layer at the upper edge of the trench to produce the trench contact; depositing and anisotropically etching back a first conducting layer forming a first electrode of the capacitor and producing the trench contact; depositing a second insulating layer as a dielectric of the capacitor; depositing a second conducting layer filling the trench and texturing the second conducting layer to form a second electrode; producing a transistor in the vicinity of the trench with a conducting region of the transistor in electrical contact with the first electrode through an opening formed in the first insulating layer; and producing word lines and bit lines.

In accordance with a another mode of the invention, there is there is provided a method which comprises forming the first insulating layer by thermal oxidation of the inner trench wall.

In accordance with a further mode of the invention, there is provided a method which comprises forming the first insulating layer by deposition of $SiO_2$.

In accordance with an added mode of the invention, there is provided a method which comprises producing the trench contact with a photographic technique in which the upper edge of the trench is bare and undeveloped resist remains on the bottom of the trench after development of the trench contact.

In accordance with an additional mode of the invention, there is provided a method which comprises adjusting the depth of the trench contact by varying a dose or duration of exposure to light.

In accordance with yet another mode of the invention, there is provided a method which comprises producing the trench contact with a photographic technique by applying first and second resist layers, and exposing the second resist layer with a trench contact mask to light.

In accordance with yet a further mode of the invention, there is provided a method which comprises back etching between application of the first and second resist layers.

In accordance with a yet an added mode of the invention, there is provided a method which comprises exposing the first resist layer to light while leaving unexposed resist on the bottom of the trench after development of the first resist layer, and subsequently applying the second resist layer.

In accordance with yet an additional mode of the invention, there is provided a method which comprises doping the first conducting layer with the aid of arsenic-TEOS.

In accordance with again another mode of the invention, there is provided a method which comprises anisotropically etching back the first conducting layer with the aid of reactive ion etching.

In accordance with again a further mode of the invention, there is provided a method which comprises producing the second insulating layer as a triple layer of polysilicon oxide, nitride, and nitride oxide.

In accordance with again an added mode of the invention, there is provided a method which comprises leaving the second insulating layer over the entire surface under the second electrode.

In accordance with again an additional mode of the invention, there is provided a method which comprises producing the conducting or insulating layer from polycrystalline silicon.

In accordance with still another mode of the invention, there is provided a method which comprises doping the polycrystalline silicon, depositing the polysilicon forming the first conducting layer undoped, and doping the polysilicon by diffusion out of the polycrystalline silicon located beneath it.

In accordance with still a further mode of the invention, there is provided a method which comprises producing the conducting or insulating layer from silicon nitride.

In accordance with still an added mode of the invention, there is provided a method which comprises producing the trench contact in a self-adjusting manner.

In accordance with still an additional mode of the invention, there is provided a method which comprises forming the opening in the first insulating layer with a wet etching, and adjusting the depth of the trench contact by varying etching time.

In accordance with another mode of the invention, there is provided a method which comprises forming the protective layer of silicon nitride.

In accordance with a further mode of the invention, there is provided a method which comprises oxidizing the surface prior to the application of the protective layer.

In accordance with an added mode of the invention, there is provided a method which comprises removing the protective layer from surfaces parallel to the substrate surface by anisotropically etching back.

In accordance with an additional mode of the invention, there is provided a method which comprises removing the protective layer from parts of the inner trench wall by isotropically etching with a photographic technique.

In accordance with a concomitant mode of the invention, there is provided a method which comprises deepening the trench by using parts of the same mask used for the production of the trench down to the depth of the trench contact.

With the objects of the invention in view, there is also provided a memory matrix, comprising at least four memory cells of a semiconductor memory configuration in a semiconductor substrate having bit lines and word lines, each of the memory cells including a center, a given width and the features mentioned above; the memory cells being parallel to a connecting line between the capacitor and the associated selection transistor in a first direction, two successive cells being disposed in mirror symmetry with an axis of symmetry extending perpendicularly to the first direction through the center of the two successive cells; and each of the the memory cells being offset by one-half the given cell width in a second direction perpendicular to the first direction.

In Published European Application No. A 0 177 066, a memory cell having a lateral connection through an opening in the insulating layer on the inner trench wall is indeed described. However, in a fundamentally different cell type which is exclusively used therein, the insulation of the individual cells is not effected by the technique known as LOCOS insulation with the aid of field oxide, but rather through a trench. Such a cell type is known as an "Isolation Merged Vertical Cell (IVEC)". In that case, the selection transistor and the bit line contact of each cell are located on a silicon island that is completely surrounded by trench paths. The capacitor of the cell is formed of electrodes buried in the trench, and each trench holds two capacitors, which have a common electrode in the middle of the trench. In that cell type, the scale of integration is restricted by the fact that the bit line contact must also be accommodated on the silicon island, so that twice as many bit line contacts are needed. Such a version is therefore not used for large scale integrated circuits, such as the 16M memory. Moreover, the concept presented in Published European Application No. A 0 177 066 has the following further problems:

1. In each trench, two capacitors are accommodated quite close to one another. In order to provide adequate isolation, an implantation of the bottom of the trench is necessary. The production of the first electrodes on the inner walls of the trench by means of the proposed etching process increases the danger of a short circuit between capacitors of two different cells, because residues easily remain behind on the bottom of the trench.

2. In order to make the contact between the capacitor and the transistor, a labor-intensive photographic technique with two resist layers and one oxide layer, which is a so-called tri-level technique, is used. Since the first insulating layer is opened on both opposed sides of one trench path, accurate adjustment is necessary.

3. Providing the cells with continuous trench paths entails the risk that the selection transistors will be decoupled from the substrate. That risk increases with the scale of integration. Parasitic capacitors are formed on the side walls of the trench.

In the configuration according to the invention, which is suitable for large scale integration, and in the methods according to the invention, these problems do not arise for the following reasons:

1. Since each trench accommodates only one capacitor, a complete removal of the material of the first electrode at the trench bottom is unnecessary. The implantation step is dispensed with. The second insulating layer, acting as a dielectric between the electrodes, covers the entire first electrode including the bottom of the trench.

2. A simple photographic technique is used for opening the first insulating layer to produce the trench contact with the transistor. According to a special embodiment of the method, texturing of the photoresist layer can also be dispensed with, or a self-adjusting contact can even be made.

3. Since the trench capacitor only occupies a small surface area and does not surround the selection transistor, decoupling of the transistor from the substrate cannot occur.

Other features which are considered as characteristic for the invention are set forth in the appended claims.

Although the invention is illustrated and described herein as embodied in a semiconductor memory configuration having capacitors with two electrodes disposed in a trench and methods for the production thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
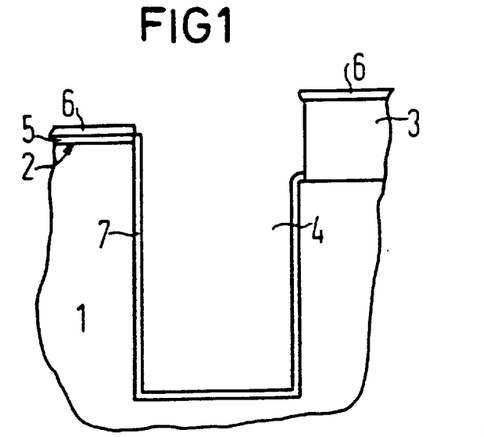
FIGS. 1–5 are fragmentary, diagrammatic, cross-sectional views of a trench capacitor, in terms of which the steps of one embodiment of the method are explained.

Referring now in detail to the figures of the drawing, in which identical elements are identified by the same reference numerals and only parts essential to the configuration and the method are shown for particular clarity, and first, particularly, to FIG. 1 thereof, there is seen a surface 2 of a semiconductor substrate 1, for example a silicon wafer, which is partly covered with field oxide 3 by the so-called LOCOS insulation process. Instead of field oxide, the insulation can also be carried out by means of buried thick oxide zones (known as buried oxide or "BOX insulation"). A trench 4 overlapping with the field oxide zone 3 is etched to receive the memory capacitor. A mask having silicon oxide 5, silicon nitride 6, and non-illustrated TEOS layers is used by a known method. When the TEOS layer is removed by means of wet etching, the field oxide 3 is also attacked somewhat. Next, oxidation of the inner wall of the trench 4 is carried out, so that from 10 to 150 nm of silicon dioxide 7 are formed as a first insulating layer. A thickness of 50 nm is preferred for the layer 7.

Figure 2:
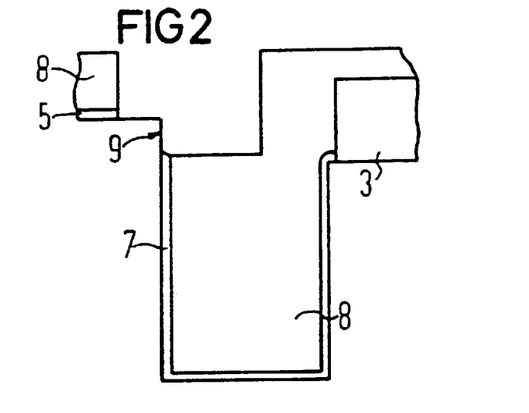

Since a slow oxidation also occurs on the nitride 6, a non-illustrated thin nitride oxide layer (NiOx) is next removed. Then the nitride mask 6 is stripped with H$_3$PO$_4$ as seen in FIG. 2. In order to open the inner wall oxide 7 at the upper edge of the trench, a simple photographic technique is used, as follows. After being coated with resist, such as in the form of a photoresist layer 8, the wafer is exposed to light through a mask with a certain dose and duration of exposure, so that when the resist 8 is developed, unexposed resist remains on the bottom of the trench. It may be useful to use a double coating of resist, with the first resist layer optionally etched back over its entire surface. At the upper edge of the trench, the oxide 5, 7 is then etched to produce a trench contact 9. Then the resist mask 8 is removed.

Figure 3:
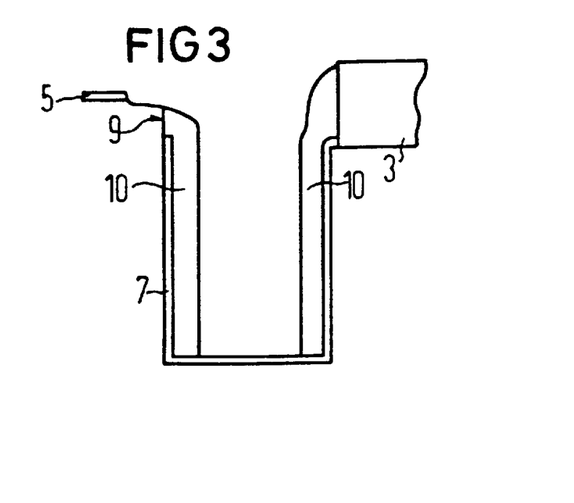

In order to produce a first (outer) electrode 10, a conductive material such as polycrystalline silicon is deposited to a thickness of approximately 100 to 150 nm as seen in FIG. 3, for example by a CVD process. The doping of the polycrystalline silicon 10 is effected either with the aid of a non-illustrated arsenic-TEOS layer by known methods, and afterward removing the layer, or simultaneously with the polysilicon deposition by the addition of dopants. After an anisotropic etching back process using chlorine or chlorine compounds, so-called spacers remain. Horizontal surfaces (that is, those parallel to the substrate surface) are free of polysilicon. The spacer 10 of polysilicon forms a connection with the substrate at the trench contact 9.

Figure 4:
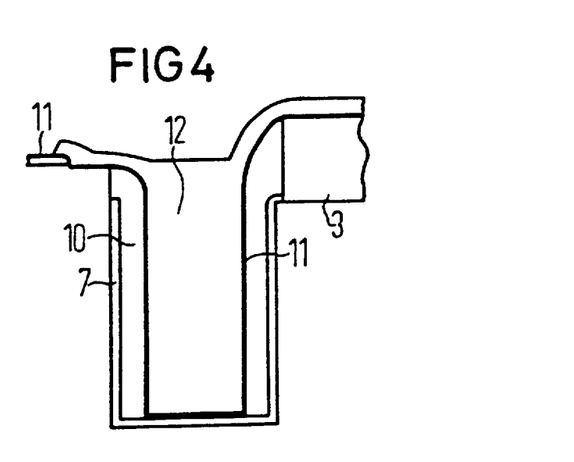

FIG. 4 shows the trench after the production of the capacitor. A dielectric 11 is deposited on the first electrode 10. It is advantageous to use a so-called triple ONO layer in a known manner, which is formed of polysilicon oxide, silicon nitride and nitride oxide, the components of which have respective thicknesses of 3 nm, 8 nm, and 2 nm, for example.

A second electrode 12 completely fills the trench. To this end, n-doped polysilicon is deposited so as to be approximately 300 nm thick and the doping can be effected with the aid of a TEOS layer. The remaining gap is filled with undoped polysilicon, which is then etched back to the upper edge of the trench. The doped polysilicon is textured by a photographic technique.

Figure 5:
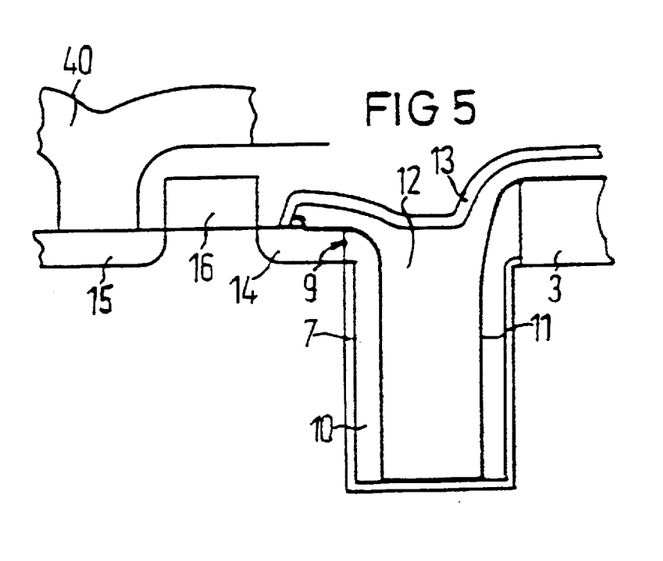
Figure 6:
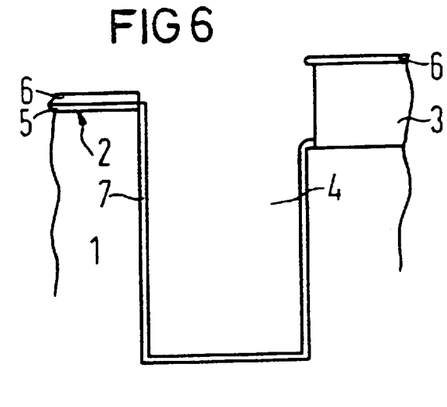
FIGS. 6–10 are views similar to FIGS. 1–5 with which the steps of another embodiment of the method are explained.

The dielectric 11 laid bare or exposed outside the capacitor and the oxide 5 underneath it are etched, as seen in FIG. 5. If the surface is then oxidized, the doped regions oxidize faster than the substrate, so that after an ensuing oxide etching, an oxide layer 13 remains on the second electrode 12.

An MOS-selection transistor with two conducting regions 14 and 15, and a gate 16 is then produced next to the capacitor by known methods, so that a source region 14, for instance, is connected through the trench contact 9 to the first electrode 10. The other steps which are necessary, such as the production of word lines and bit lines 40 including a contact between the bit line 40 and one of the conducting regions 15 (drain region), are performed by known methods.

According to a non-illustrated variation of the course of the process, it is possible for the nitride layer 6 not to be removed until after the etching of the polysilicon spacer 10 in the trench, or after the texturing of the second polysilicon electrode 12. This assures that during the polysilicon spacer etching, the substrate located in the planar zone under the trench contact window will still be covered with oxide 5 and nitride 6 and not be attacked by the spacer etching.

FIGS. 6–10 show a method for producing the configuration according to the invention, which is substantially identical to the first method, and therefore only the changes will be described in detail below.

Figure 7:
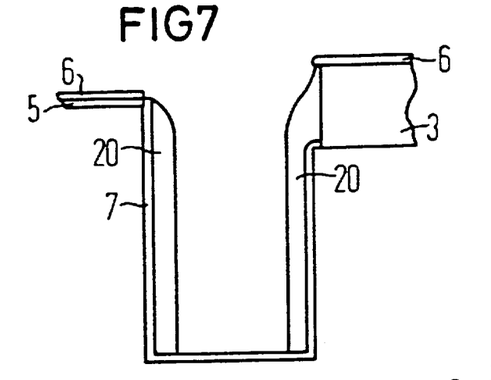
Figure 8:
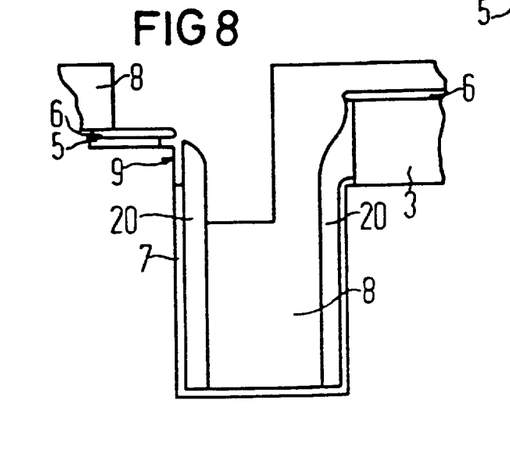
Figure 9:
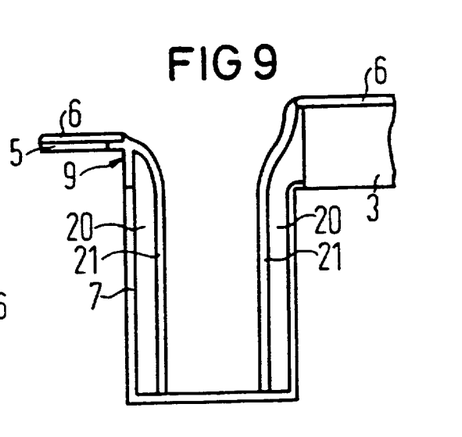
Figure 10:
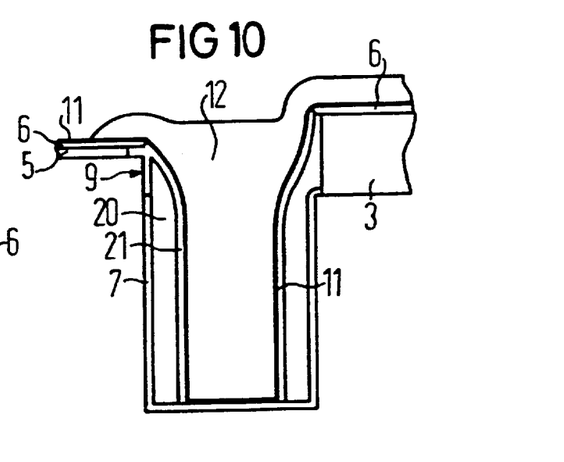

Prior to the photographic technique for producing the trench contact, a polysilicon spacer 20 is already produced at the side wall of the trench on the side wall oxide 7, as seen in FIG. 7. After the photographic technique and by etching the oxide 5 and 7 at the upper edge of the trench, polysilicon 21 is, again deposited and etched back, as seen in FIG. 9. In this process, the gap at the upper edge of the trench, from which the oxide 5, 7 has been etched out, is filled with polysilicon 21, so that a contact is formed there. The doping of the polysilicon can be affected in the generation of the first and/or second polyspacer. The advantages of this variation in the process are as follows:

a) The depth of the trench contact is independent of the lower edge of resist in the trench; it is dependent only on the oxide over-etching beginning at the upper edge of the first polysilicon spacer 20, and on the location of this upper edge of the spacer. This makes it possible to produce very flat trench contacts.

b) In the etching of the side wall trench oxide, the field oxide edge is laterally covered by the first polysilicon spacer 20 and thus protected against lateral oxide etching. In FIG. 8, the use of a photographic technique is shown, but the production of a trench contact that is self-aligned to the active region (that is, it requires no photographic technique) is also possible.

c) If the doping of the first electrode is effected at the time of the deposition of the first polysilicon layer 20, the second polysilicon layer 21 can be deposited undoped or amorphous silicon may be used. The second polysilicon layer is not doped until the continuation of the process by diffusion out of the first layer. This may be advantageous for making a very thin and reliable capacitor dielectric. The roughness of the first polysilicon layer may be less with this kind of procedure.

d) During the ansisotropic etching process for forming the first electrode 10, the surface 2 of the semiconductor substrate 1 is covered with the oxide layer 5 and with the nitride layer 6. This includes the immediate vicinity of the trench (as seen in FIG. 7), so that, in contrast to the first embodiment (as seen in FIG. 3), the semiconductor substrate is protected against damage or erosion by the etching process. Such damage or erosion could lead to disadvantages and problems for the transister which is later to be produced at that location.

The first two advantages mentioned above can also be attained if the first spacer 20 is formed of nitride instead of polysilicon.

FIG. 11–16 illustrate a further method that provides two trench etchings. The depth of the contact is determined by the depth of the first trench which is made. A first trench 30 is etched by a known method approximately 200 to 400 nm deep into the substrate and is oxidized approximately 20 nm thick to form an oxide layer 31.

Figure 11:
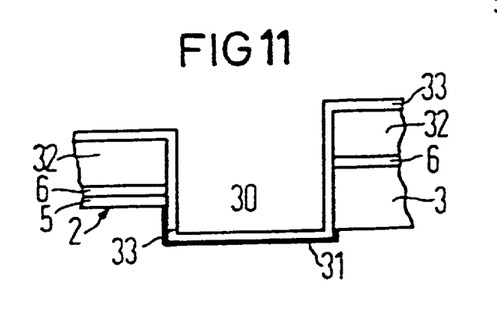
FIGS. 11–16 are also views similar to FIGS. 1–5 through which two further embodiments of the method are explained in terms of a cross section through a trench capacitor.
Figure 12:
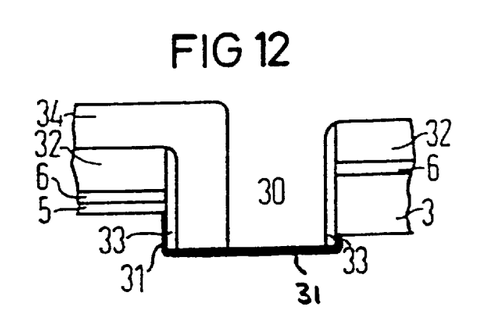
Figure 13:
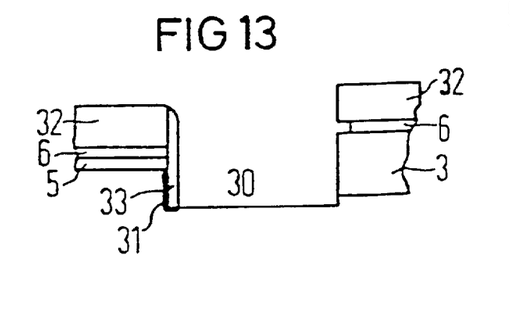

The trench mask, which is formed of silicon oxide 5, silicon 6, and TEOS 32 is initially not removed. Approximately 30 nm of silicon nitride 33 are deposited over it, as seen in FIG. 11. In FIG. 12, the nitride is etched back except for spacers at the vertical inner walls of the trench. Through the use of a further oxidation process, NiOx or silicon oxide forms on the entire non-illustrated surface. A resist mask 34 which is applied, excludes the side of the trench on which field oxide 3 is located from the ensuing nitride etching process. For this purpose, an isotropic or "down stream" etching process can be used, which has high selectivity with respect to oxide and it may possibly be necessary to remove NiOx beforehand, as seen in FIG. 13. The resist mask 34 and the thin oxide layer 31 present beneath it on the trench bottom, are removed.

Figure 14:
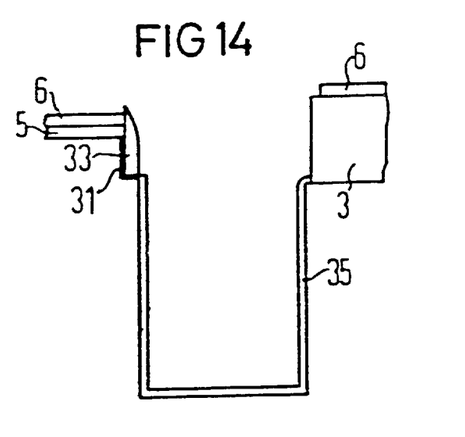
Figure 15:
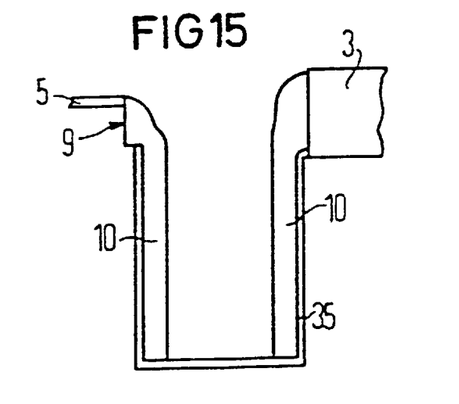

Next, the trench is etched to the depth of the later capacitor with the still present trench mask 5, 6, 32, as seen in FIG. 14. This etching also removes parts of the nitride spacer 33. The remaining TEOS layer 32 of the trench mask is etched away. A first insulating layer 35 is formed, for instance of 120 nm of silicon oxide, on the inner trench wall.

Figure 16:
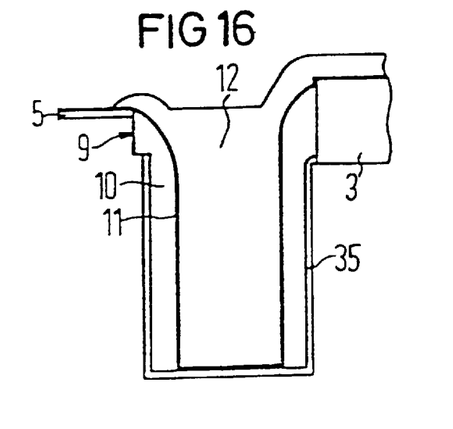

The possibly present thin NiOx film on the nitride spacer 33 is removed with a brief oxide etching, so that the remaining nitride 33 on the upper edge of the trench can be subsequently stripped. The process used for this purpose must have good selectivity for oxide. For instance, wet etching with $H_3PO_4$ is suitable. The thin oxide 31 present under the nitride spacer 33 is wet-stripped. At this point an opening is then present in the insulating layer 35 on the upper edge of the trench, which makes it possible to provide the contact 9 with the later transistor. The formation of the first electrode 10 of the capacitor and the further course of the process as seen in FIG. 16, are analogous to the methods described above.

Figure 17:
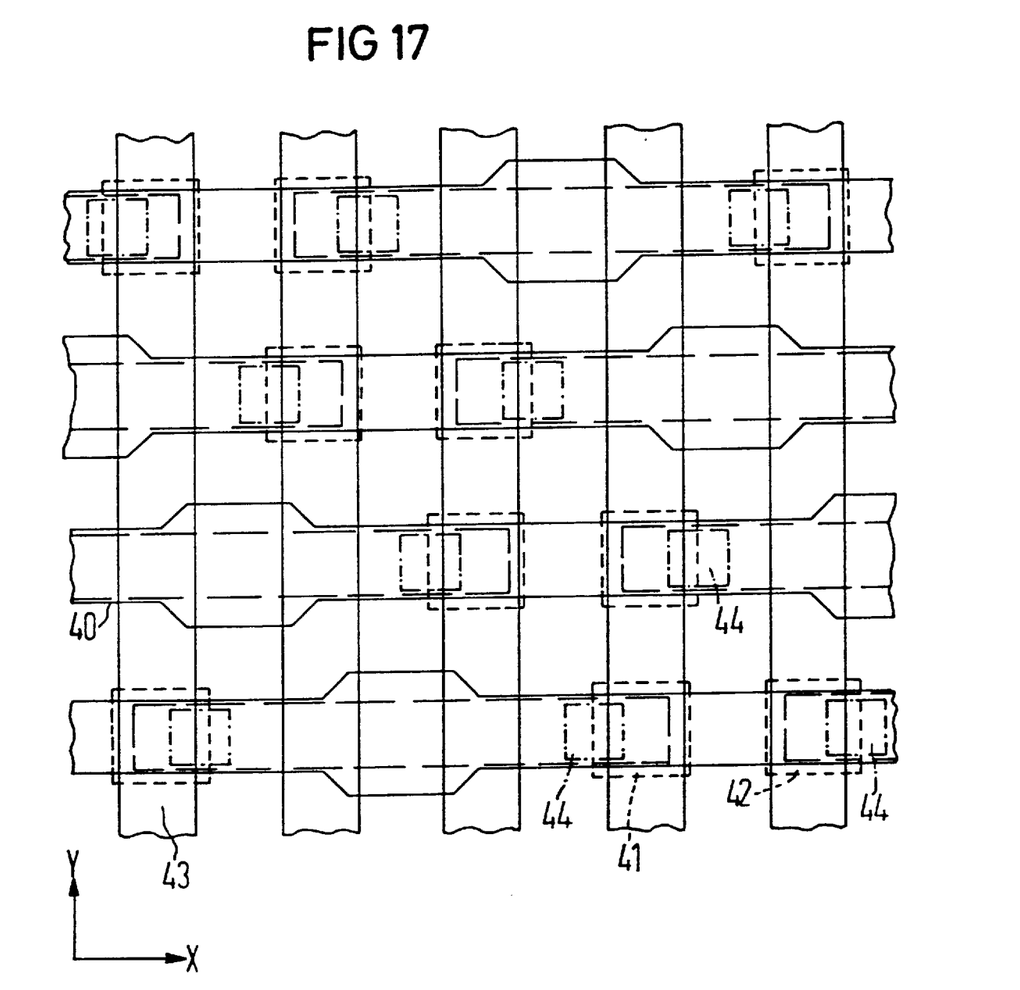
FIG. 17 is a fragmentary plan view of a memory matrix with an advantageous geometric configuration of memory cells.

An advantageous geometrical configuration of the cells according to the invention in a memory matrix, are shown diagrammatically as a plan view of the surface in FIG. 17. In a first direction, which extends parallel to the connecting line between the trench capacitor and the associated selection transistor (that is, the direction labelled X which is parallel to bit lines 40), two successive cells are disposed in mirror symmetry. Capacitors 41, 42 and transistors of two cells are each respectively located beside one another. In a second direction perpendicular thereto (that is, parallel to word lines 43 in a direction labelled Y), the location of the cells is offset, specifically by one-half the length of one cell per bit line. As a result, a basic grid of four bit lines is formed, after which the configuration repeats.

By combining the mirror-symmetrical configuration in the first direction and the offset of the cells in the second direction, the largest possible spacing between trench contacts 44 (equivalent to the zone or trench contact 9 in the previously discussed drawing figures) is attained, and the reliability of the memory is increased.

We claim:

1. Method for producing a semiconductor memory configuration in a semiconductor substrate having memory cells each including one trench capacitor and one MOS selection transistor, which comprises:

forming a trench with an inner trench wall and an upper edge in a semiconductor substrate for receiving a memory capacitor;

producing a first insulating layer on the inner trench wall;

forming an opening in the first insulating layer at a location on the upper edge of the trench for producing a contact with the substrate;

depositing and anisotropically etching back a first conducting layer for forming a first electrode of the capacitor;

depositing a second insulating layer as a dielectric of the capacitor;

depositing a second conducting layer filling the trench, and texturing the second conducting layer to form a second electrode;

producing a transistor in the vicinity of the trench with a conducting region of the transistor in electrical contact with the first electrode through the opening in the first insulating layer; and producing word lines and bit lines.

2. Method for producing a semiconductor memory configuration in a semiconductor substrate having memory cells each including one trench capacitor and one MOS selection transistor, which comprises:

forming a trench with an inner trench wall and an upper edge in a semiconductor substrate for receiving a capacitor;

producing a first insulating layer on the inner trench wall;

depositing a conducting or insulating layer and anisotropically etching back;

forming an opening in the first insulating layer at a location on the upper edge of the trench for producing a contact with the substrate;

depositing a first conducting layer bonding the substrate through the opening and forming a first electrode of the capacitor by anisotropically etching back;

depositing a second insulating layer as a dielectric of the capacitor;

depositing a second conducting layer filling the trench and texturing the second conducting layer to form a second electrode;

producing a transistor in the vicinity of the trench with a conducting region of the transistor in electrical contact with the first electrode through the opening in the first insulating layer; and producing word lines and bit lines.

3. Method for producing a semiconductor memory configuration having memory cells each including one trench capacitor and one MOS selection transistor, in a semiconductor substrate having a surface, which comprises:

forming a trench with an inner trench wall in a semiconductor substrate down to the depth of a trench contact to be subsequently produced;

applying a protective layer for the trench contact;

removing the protective layer from surfaces parallel to the substrate surface and from part of the inner trench wall;

deepening the trench down to the total depth of a capacitor to be subsequently produced;

applying a first insulating layer to the inner trench wall;

removing the remaining protective layer at the upper edge of the trench to produce the trench contact;

depositing and anisotropically etching back a first conducting layer forming a first electrode of the capacitor and producing the trench contact;

depositing a second insulating layer as a dielectric of the capacitor;

depositing a second conducting layer filling the trench and texturing the second conducting layer to forms a second electrode;

producing a transistor in the vicinity of the trench with a conducting region of the transistor in electrical contact with the first electrode through an opening formed in the first insulating layer; and producing word lines and bit lines.

4. Method according to claim 1, which comprises producing the trench contact with a photographic technique in which the upper edge of the trench is bare and undeveloped resist remains on the bottom of the trench after development of the trench contact.

5. Method according to claim 2, which comprises producing the trench contact with a photographic technique in which the upper edge of the trench is bare and undeveloped resist remains on the bottom of the trench after development of the trench contact.

6. Method according to claim 1, which comprises adjusting the depth of the trench contact by varying a dose of exposure to light.

7. Method according to claim 1, which comprises adjusting the depth of the trench contact by varying a duration of exposure to light.

8. Method according to claim 1, which comprises producing the trench contact with a photographic technique by applying first and second resist layers, and exposing the second resist layer with a trench contact mask to light.

9. Method according to claim 2, which comprises producing the trench contact with a photographic technique by applying first and second resist layers, and exposing the second resist layer with a trench contact mask to light.

10. Method according to claim 8, which comprises back etching between application of the first and second resist layers.

11. Method according to claim 9, which comprises back etching between application of the first and second resist layers.

12. Method according to claim 8, which comprises exposing the first resist layer to light while leaving unexposed resist on the bottom of the trench after development of the first resist layer, and subsequently applying the second resist layer.

13. Method according to claim 9, which comprises exposing the first resist layer to light while leaving unexposed resist on the bottom of the trench after development of the first resist layer, and subsequently applying the second resist layer.

14. Method according to claim 1, which comprises producing the second insulating layer as a triple layer of polysilicon oxide, nitride, and nitride oxide.

15. Method according to claim 2, which comprises producing the second insulating layer as a triple layer of polysilicon oxide, nitride, and nitride oxide.

16. Method according to claim 3, which comprises producing the second insulating layer as a triple layer of polysilicon oxide, nitride, and nitride oxide.

17. Method according to claim 1, which comprises leaving the second insulating layer over the entire surface under the second electrode.

18. Method according to claim 2, which comprises leaving the second insulating layer over the entire surface under the second electrode.

19. Method according to claim 3, which comprises leaving the second insulating layer over the entire surface under the second electrode.

20. Method according to claim 2, which comprises producing the conducting or insulating layer from polycrystalline silicon.

21. Method according to claim 20, which comprises doping the polycrystalline silicon, depositing the polysilicon forming the first conducting layer undoped, and doping the polysilicon by diffusion out of the polycrystalline silicon located beneath it.

22. Method according to claim 2, which comprises producing the conducting or insulating layer from silicon nitride.

23. Method according to claim 2, which comprises producing the trench contact self-aligned to the conducting region of the transistor and to said first electrode.

24. Method according to claim 2, which comprises forming the opening in the first insulating layer with a wet etching, and adjusting the depth of the trench contact by varying etching time.

25. Method according to claim 3, which comprises forming the protective layer of silicon nitride.

26. Method according to claim 3, which comprises oxidizing the surface prior to the application of the protective layer.

27. Method according to claim 3, which comprises removing the protective layer from surfaces parallel to the substrate surface by anisotropically etching back.

28. Method according to claim 3, which comprises removing the protective layer from parts of the inner trench wall by isotropically etching with a photographic technique.

29. Method according to claim 3, which comprises deepening the trench by using parts of the same mask used for the production of the trench down to the depth of the trench contact.

30. Method according to claim 1, which further comprises:

defining an imaginary line between the capacitor and the conducting region, with a first direction being parallel to the line and a second direction being perpendicular to the first direction;

disposing two successive cells in mirror symmetry with an axis of symmetry extending perpendicularly to the first direction centrally between two successive cells; and offsetting each of the memory cells by one-half a cell width in the second direction.

31. Method according to claim 2, which further comprises:

defining an imaginary line between the capacitor and the conducting region, with a first direction being parallel to the line and a second direction being perpendicular to the first direction;

disposing two successive cells in mirror symmetry with an axis of symmetry extending perpendicularly to the first direction centrally between two successive cells; and offsetting each of the memory cells by one-half a cell width in the second direction.

32. Method according to claim 3, which further comprises:

defining an imaginary line between the capacitor and the conducting region, with a first direction being parallel to the line and a second direction being perpendicular to the first direction;

disposing two successive cells in mirror symmetry with an axis of symmetry extending perpendicularly to the first direction centrally between two successive cells; and offsetting each of the memory cells by one-half a cell width in the second direction.

* * * * *